United States Patent
Seesemann

(10) Patent No.: US 6,384,733 B1
(45) Date of Patent: May 7, 2002

(54) TEMPERATURE MONITORING APPARATUS FOR MICROPROCESSOR COOLING DEVICES

(76) Inventor: Matthias Seesemann, Feldbergstrasse 5, D-61273 Wehrheim (DE)

(*) Notice: Subject to any disclaimer, the term of this patent is extended or adjusted under 35 U.S.C. 154(b) by 0 days.

(21) Appl. No.: 09/894,395

(22) Filed: Jun. 28, 2001

(30) Foreign Application Priority Data

Feb. 15, 2001 (DE) .......................................... 101 07 492

(51) Int. Cl.$^7$ .............................................. G08B 21/00
(52) U.S. Cl. ...................... 340/648; 340/584; 340/670; 361/695; 307/117; 307/125
(58) Field of Search ................................. 340/584, 635, 340/648, 670; 361/695, 697; 307/125, 117

(56) References Cited

U.S. PATENT DOCUMENTS

| | | | | |
|---|---|---|---|---|
| 5,727,928 A | * | 3/1998 | Brown | ......................... 361/695 |
| 5,920,264 A | * | 7/1999 | Kim et al. | .................... 340/584 |
| 6,014,611 A | * | 1/2000 | Arai et al. | .................... 702/132 |
| 6,023,402 A | * | 2/2000 | Kaminski | .................... 361/695 |
| 6,172,611 B1 | * | 1/2001 | Hussain et al. | ............. 340/584 |
| 6,247,898 B1 | * | 6/2001 | Henderson et al. | ............ 417/3 |
| 6,259,172 B1 | * | 7/2001 | Lee | ............................. 361/695 |

* cited by examiner

Primary Examiner—Daniel J. Wu
(74) Attorney, Agent, or Firm—Collard & Roe, P.C.

(57) ABSTRACT

A temperature monitoring apparatus for microprocessors, having a fan device for producing an air stream for cooling the microprocessor. The temperature of the microprocessor is sensed by means of a heat sensing resistor mounted in the area of the surface thereof, and a regulator circuit is provided for increasing the speed of the fan at rising temperatures, and decreasing it at falling temperatures, based upon the temperature sensed by the heat sensing resistor. A speed monitoring device is also provided for monitoring a presettable speed range of the fan, and emits a warning signal in cooperation with an electronic circuit, in order to notify a user of an apparatus operated with the microprocessor, to manually switch off the same when the preset speed range of the fan is exceeded. This effectively prevents an overheating of a microprocessor.

7 Claims, 1 Drawing Sheet

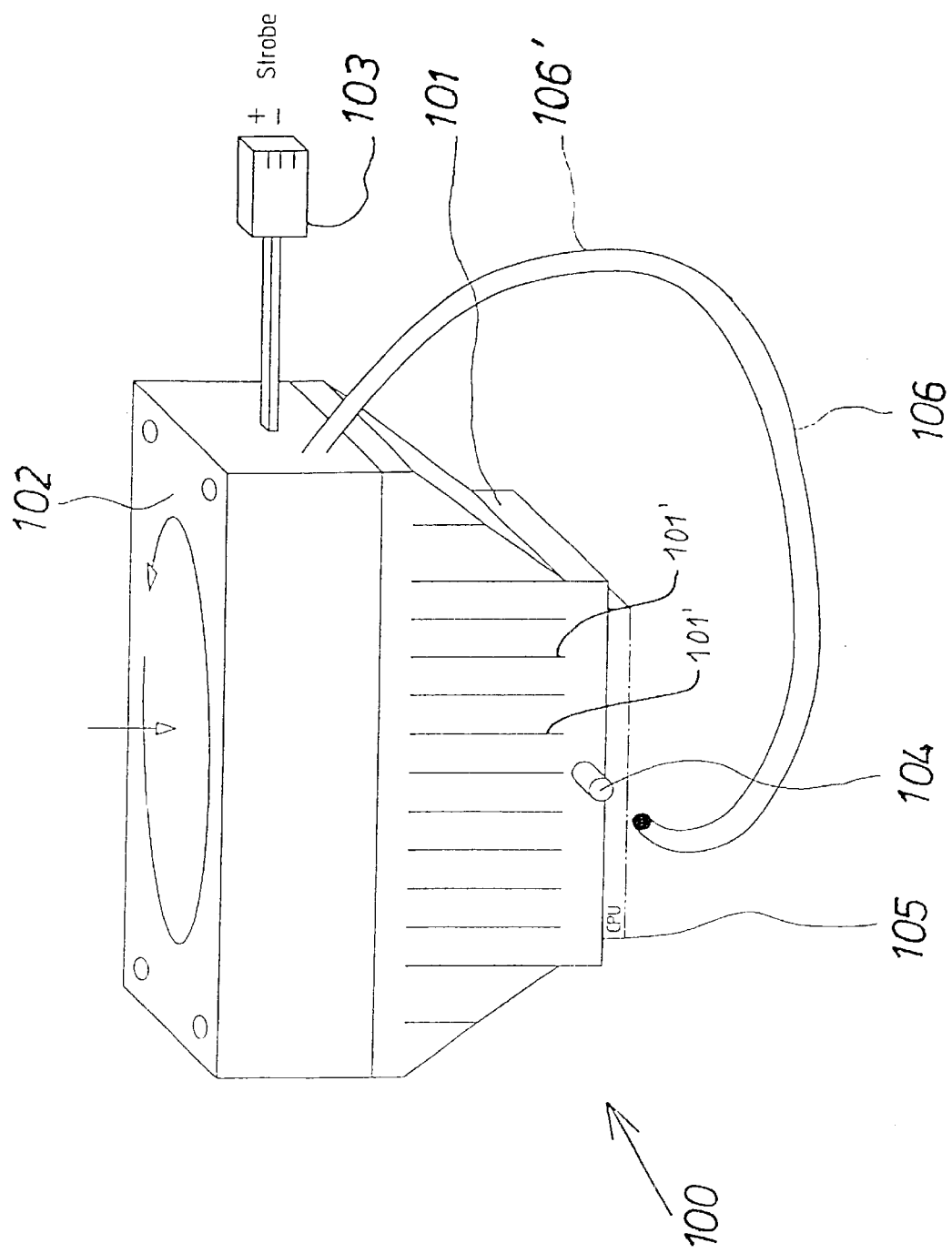

TEMPERATURE MONITORING APPARATUS FOR MICROPROCESSOR COOLING DEVICES

BACKGROUND OF THE INVENTION

1. Field of the Invention

This invention relates to a temperature monitoring apparatus for microprocessors, having a fan device for producing an air stream for cooling the microprocessor. The inventive temperature monitoring apparatus can, additionally be used for desk top personal computers, or similar, or similar temperature-sensitive apparatus.

2. The Prior Art

Temperature monitoring apparatus for sensing the temperature of electrical components are known in the prior art. However, known temperature monitoring apparatus failures altogether have the disadvantage that due to overheating cannot be effectively prevented. An object of the invention is therefore to provide a temperature monitoring apparatus which can effectively prevent overheating of a microprocessor.

SUMMARY OF THE INVENTION

In these type of temperature monitoring apparatus, the temperature of the microprocessor is sensed by means of a heat probe mounted in the area of its surface. A regulator circuit is provided for increasing the speed of the fan device when the temperature rises, and decreasing it at falling temperature, based on the temperature sensed by the heat probe. A speed monitoring device is also provided for monitoring a presettable speed range of the fan device, and emits a warning signal in cooperation with an electronic circuit, in order to notify the user of an apparatus, operated with the microprocessor to manually switch off the same when the preset speed range of the fan device is exceeded.

In the inventive temperature monitoring apparatus, the temperature of the microprocessor is to be sensed by means of a heat probe mounted in the area of its surface. A regulator circuit is also provided for increasing the speed of the fan at rising temperatures, and decreasing it at falling temperatures depending upon the temperature sensed by the heat probe. A speed monitoring device is also provided for monitoring a presettable speed range of the fan, and emits a warning signal in cooperation with an electronic circuit in order to ask a user of an apparatus operated with the microprocessor to manually switch off the same when the present speed range of the fan device is exceeded. It is possible to provide an apparatus having a further monitoring device which can reliably avoid overheating of the microprocessor in case sufficient cooling cannot be ensured by means of the regulator alone, for example upon nonfunctioning or poor functioning of the fan.

In a first preferred embodiment of the inventive apparatus, the heat probe sensing the temperature of the microprocessor is disposed in a bore formed in the bottom of a heat sink of the microprocessor. The fan device is preferably disposed on the heat sink of the microprocessor.

In another preferred embodiment of the inventive apparatus, the speed monitoring device for monitoring a presettable speed range of the fan contains a device that delivers a stroboscope signal clocked with the rotational frequency of the fan and contains a device clocked with a preset frequency for evaluating the stroboscope signal.

In still a further preferred embodiment of the inventive apparatus, the fan is dimensioned so as to be able to deliver an air quantity of about 80 cubic meters per hour.

The heat probe of the inventive apparatus is preferably formed as an NTC thermistor.

In accordance with a further preferred embodiment of the inventive apparatus, the heat probe is formed alternatively as an NTC resistor that acts functionally as a regulator circuit.

BRIEF DESCRIPTION OF THE DRAWINGS

Other objects and features of the present invention will become apparent from the following detailed description considered in connection with the accompanying drawing. It should be understood, however, that the drawing is designed for the purpose of illustration only, and not as a definition of the limits of the invention.

The FIGURE shows a preferred embodiment of the inventive temperature monitoring apparatus in an oblique top view.

DETAILED DESCRIPTION OF THE PREFERRED EMBODIMENT

Referring to the FIGURE, temperature monitoring apparatus 100 has fan device 102 with a fan for producing an air stream for cooling microprocessor 105. Fan device 102 is disposed on solid block or heat sink 101 provided with cooling ribs 101' and connected with microprocessor 105 in heat-conducting fashion via a common contact area. The temperature of microprocessor 105 is sensed by means of heat probe 104, mounted in a space, or bore, close to the contact area of microprocessor 105, within block 101.

In this embodiment of the temperature monitoring apparatus 100, heat probe 104 is formed as an NTC resistor. It could also be a thermistor.

It is thus unnecessary to provide a separate regulator circuit, since the NTC resistor is inserted into the circuit of fan device 102 via lines 106, 106' so as to act functionally as a regulator circuit.

In addition to the speed regulation by heat probe 104 formed as an NTC resistor, speed monitoring device 103 is provided for monitoring a presettable speed range of fan device 102, and emitting a warning signal in cooperation with an electronic circuit (not shown), or suitable software in order to notify the user of the apparatus operating with microprocessor 105, to manually switch it off when the present speed range of fan device 102 is exceeded. Fan device 102 is dimensioned so as to have the capacity to deliver an air quantity of about 80 cubic meters per hour.

In accordance with another embodiment of apparatus 100, a regulator circuit, not shown, is provided to increase the speed of fan device 102 at a rising temperature, or decrease it at a falling temperature, based on the temperature sensed by electronic heat probe 104.

In another embodiment, speed monitoring device 103 for monitoring a presettable speed range of the fan contains a device that delivers a stroboscope signal clocked with the rotational frequency of the fan, and contains a device clocked with a present frequency for evaluating the stroboscope signal.

While only a few embodiments of the present invention have been shown and described, it is to be understood that many changes and modifications may be made thereunto without departing from the spirit and scope of the invention as defined in the appended claims.

What is claimed is:

1. A temperature monitoring apparatus for microprocessors, having a fan device for producing an air stream for cooling the microprocessor, comprising:

a heat probe mounted in the area of the microprocessor surface for sensing the temperature thereof;

a regulator circuit for increasing the speed of the fan device at a rising temperature, and decreasing it at a falling temperature based on the temperature sensed by said heat probe; and a speed monitoring device for monitoring a presettable speed range of the fan device, and emitting a warning signal in cooperation with an electronic circuit in order to alert the user to manually switch off the microprocessor when the preset speed range of the fan device is exceeded.

2. The apparatus according to claim 1, wherein said heat probe sensing the temperature of the microprocessor is disposed in a bore formed in the bottom of a heat sink of the microprocessor.

3. The apparatus according to claim 2, wherein the fan device is disposed on the heat sink of the microprocessor.

4. The apparatus according to claim 3, wherein said speed monitoring device for monitoring a presettable speed range of said fan device comprises a device for delivering a stroboscope signal clocked with the rotational frequency of the fan of said fan device, and further comprises a device clocked with a preset frequency for evaluating the stroboscope signal.

5. The apparatus according to claim 1, wherein the fan device is dimensioned so as to be able to deliver an air quantity of about 80 cubic meters per hour.

6. The apparatus according to claim 1, wherein said heat probe is formed as an NTC thermistor.

7. The apparatus according to claim 1 wherein said heat probe comprises an NTC resistor that functions as a regulator circuit.

* * * * *